(12) United States Patent
Liao

(10) Patent No.: US 6,296,334 B1
(45) Date of Patent: Oct. 2, 2001

(54) LATCH MECHANISM FOR A HOUSING

(75) Inventor: Nien Chiang Liao, Lu-Chou (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/482,158

(22) Filed: Jan. 12, 2000

(30) Foreign Application Priority Data

Aug. 10, 1999 (TW) .................................................. 88213501

(51) Int. Cl.[7] .................................................... H05K 5/00
(52) U.S. Cl. .................................... 312/223.2; 312/265.6; 292/128; 292/DIG. 37
(58) Field of Search ............................ 312/223.2, 223.1, 312/215, 222, 265.6, 290; 361/683, 684, 724, 725, 726, 727; 292/8, 31, 128, 146, DIG. 37

(56) References Cited

U.S. PATENT DOCUMENTS

| | | | |
|---|---|---|---|
| 5,713,647 | * | 2/1998 | Kim .................................... 312/223.2 |
| 5,751,545 | * | 5/1998 | Jung ............................... 312/223.2 X |
| 5,785,398 | * | 7/1998 | Park ................................ 312/265.6 X |
| 5,823,644 | * | 10/1998 | Suh et al. ........................... 312/223.2 |
| 5,825,626 | * | 10/1998 | Hulick et al. .................. 312/223.2 X |
| 6,074,028 | * | 6/2000 | Ho ....................................... 312/223.2 |
| 6,108,196 | * | 8/2000 | Jung ................................. 292/128 X |
| 6,134,116 | * | 10/2000 | Hoss et al. ....................... 292/146 X |

* cited by examiner

Primary Examiner—Peter M. Cuomo
Assistant Examiner—James O. Hansen
(74) Attorney, Agent, or Firm—Wei Te Chung

(57) ABSTRACT

A computer housing has a front panel, a cover and a chassis, wherein the front panel and the cover are connected together. A mechanism for latching and releasing the front panel and the cover with and from the chassis include a match opening defined in a side of the front panel, a latch member, a spring and a locking hole defined in the chassis. The latch member has an arm extending towards the chassis terminating in a hooked portion to engage the locking hole. The latch member and the spring are received in the matching opening and are movable between a locked position where the arm is locked in the locking hole and a released position where the arm disengages the locking hole. The spring urges against the base to retain the latch member in the locked position.

14 Claims, 6 Drawing Sheets

LATCH MECHANISM FOR A HOUSING

BACKGROUND OF THE INVENTION

1. Field of the invention

The present invention relates to a housing having a chassis, a cover and a front panel such as a personal computer, and more particularly to a mechanism for latching and releasing the front panel and the cover with and from the chassis.

2. The Related Art

As development of computer has advanced, this industrial field is more and more professionalized and divided into computer housing manufacturer, monitor manufacturer, PCB manufacturer, drive manufacturer and so on. Components from these different manufacturers are then transferred to a system manufacturer and assembled into a finished product there. During the assembly, a computer housing is usually disassembled and reassembled several times to subsequently assemble each component in it. Thus, how to simplify the assembly of the computer housing now becomes a problem to be hastily resolved.

A conventional computer generally comprises a front panel, a U-shaped cover and a chassis, wherein the front panel and the cover are respectively mounted on the chassis. As Taiwan Patent Application No. 85202167 discloses, opposite sides of a front panel integrally define two hooks respectively for engaging corresponding slots in side walls of a chassis thereby mounting the front panel to the front of the chassis. Then a cover is mounted on the chassis and latched with the side walls of the chassis. The problem is that when to remove the front panel, the cover must be removed first to provide accessible space, which is quite inconvenient and inefficient.

Taiwan patent application No. 81209656 also disclosed the mounting of a computer front panel. Upper and lower edges of the front panel define hooks to respectively latch its cover and chassis. The lower edge further defines a slanted surface on which there are openings corresponding to the lower hooks for facilitating accessing the lower hooks. Thus, the cover does not need to be removed first when to remove the front panel as the lower hooks can be released from the openings. However, the problem is that the lower hooks can not be determined their positions by eye vision and results in inefficiency. Moreover, the openings can not prevent dust and moisture.

Therefore, there is a need for an improved latch mechanism for a housing for readily assembling and disassembling the housing without the shortcomings of the prior art.

SUMMARY OF THE INVENTION

It is an object of the present invention to provide a latch mechanism for simply assembling and disassembling a housing.

It is another object of the present invention to provide a housing having a front panel, a cover and a chassis, wherein assembling and disassembling the housing only includes one operation procedure.

It is a further object of the present invention to provide simplified construction of a latch mechanism.

In accordance with the present invention, a computer housing has a front panel, a cover and a chassis, wherein the front panel and the cover are connected together. A mechanism for latching and releasing the front panel and the cover with and from the chassis include a match opening defined in a side of the front panel, a latch member, a spring and a locking hole defined in the chassis. The latch member has an arm extending towards the chassis terminating in a hooked portion to engage the locking hole. The latch member and the spring are received in the matching opening and are movable between a locked position where the arm is locked in the locking hole and a released position where the arm disengages the locking hole. The spring urges against the base to retain the latch member in the locked position.

Other objects, advantages and novel features of the invention will become more apparent from the following detailed description of a preferred embodiment thereof when taken in conjunction with the accompanying drawings, wherein:

DETAILED DESCRIPTION OF THE PREFERRED EMBODIMENT

Figure 1:
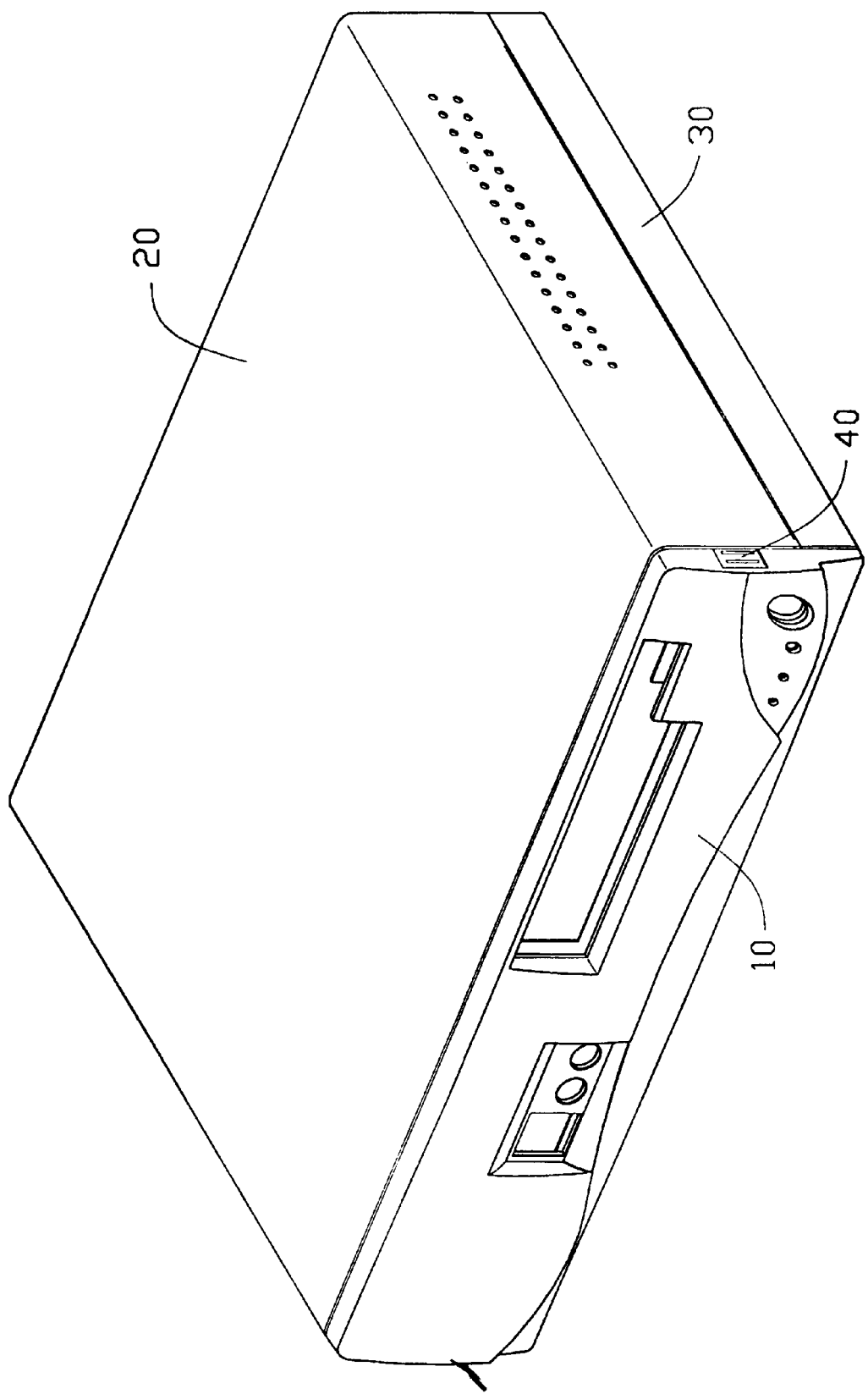
FIG. 1 is a perspective view of a personal computer in the state where a front panel and a cover are latched with a chassis.
Figure 2:
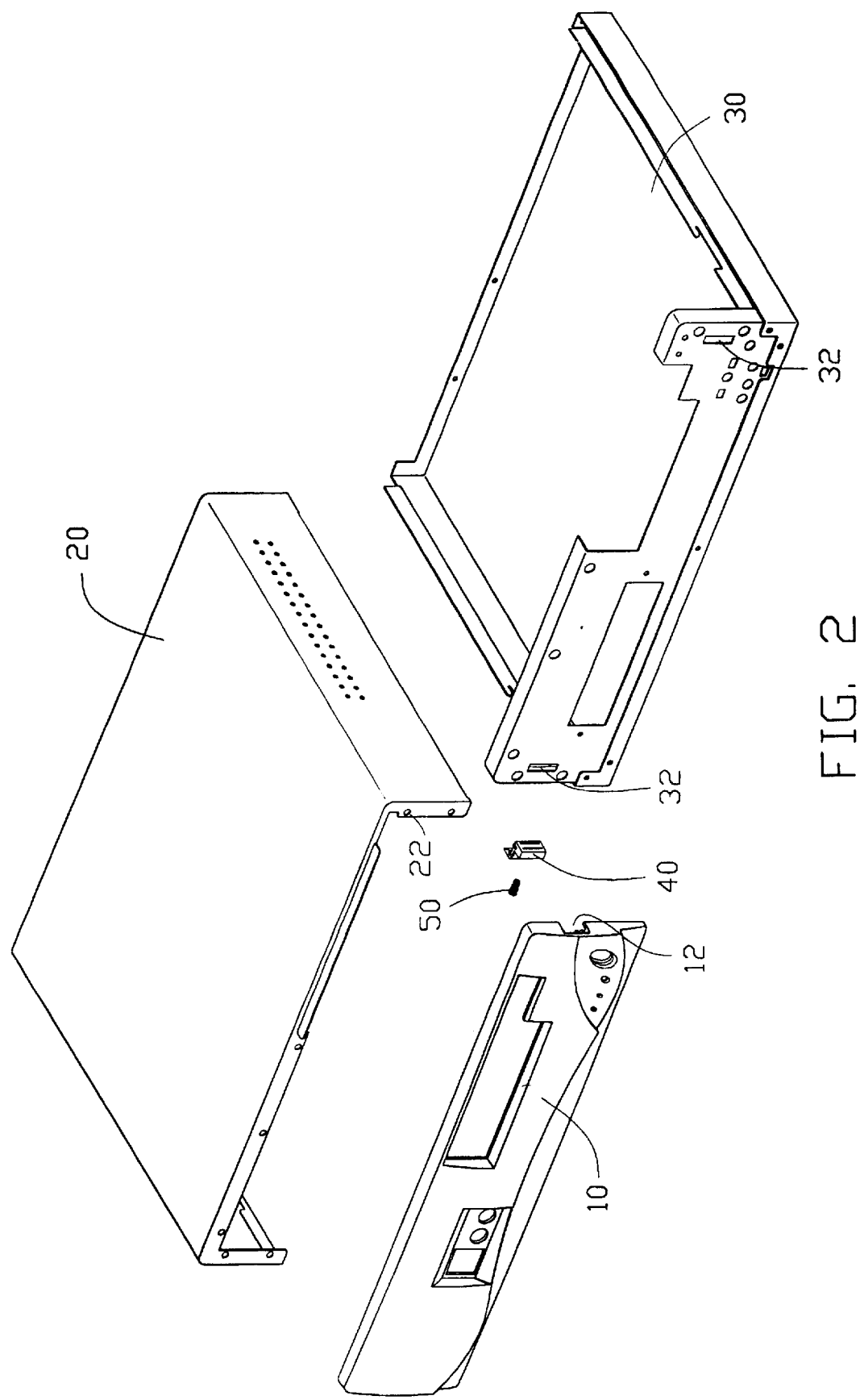
FIG. 2 is an exploded view of FIG. 1 in the state where the front panel and the cover are disassembled from the chassis showing a latch mechanism in accordance with the present invention.
Figure 3:
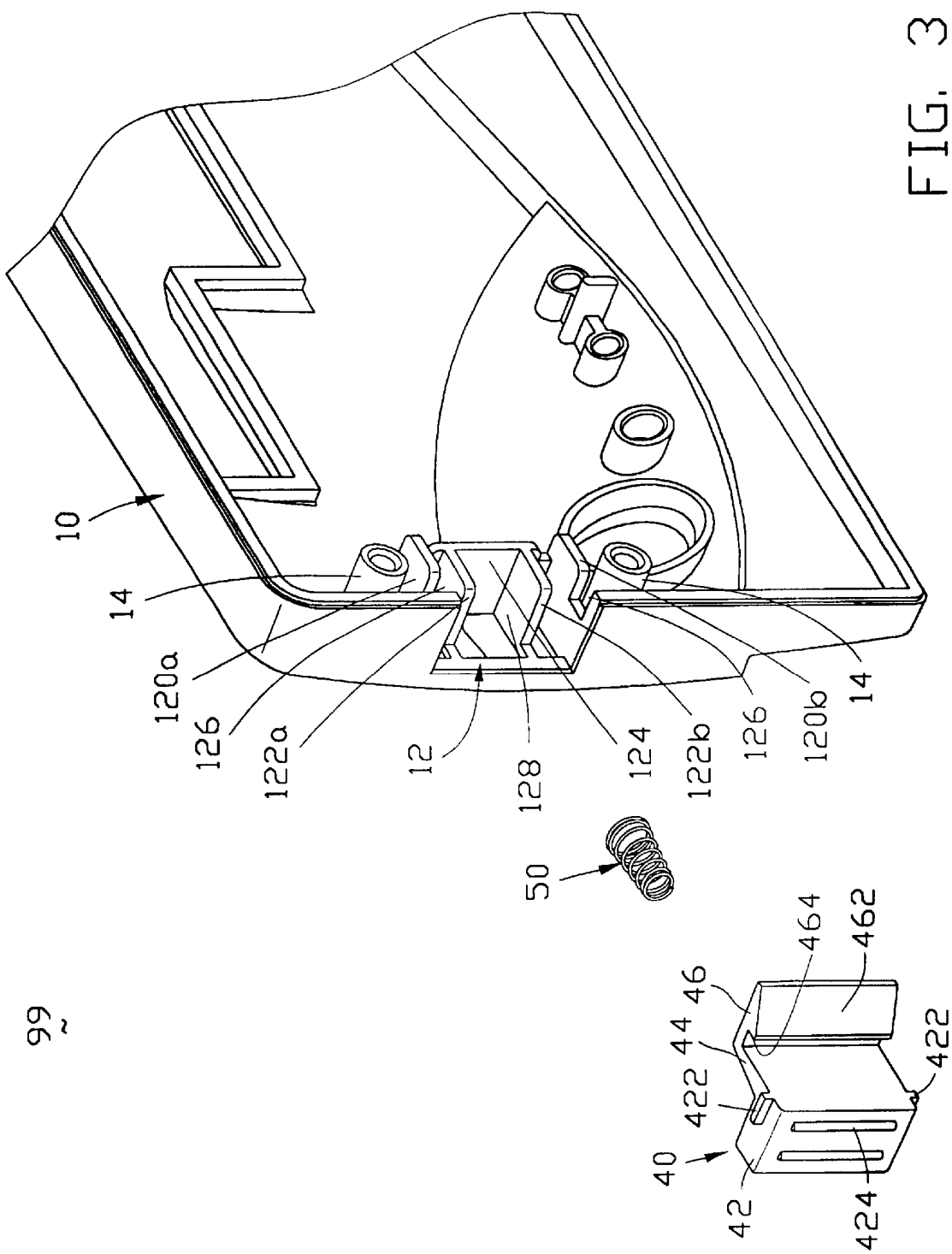
FIG. 3 is an enlarged exploded view of a preferred embodiment of the latch mechanism of this invention.

Referring more in detail to the drawings, the illustration shows a housing having a front panel 10, a cover 20 and a chassis 30, which is applied to a personal computer. As better shown in FIGS. 1–2, the front panel 10 and the cover 20 are connected together by screws, or by posts 14 extending backwardly from the front panel 10 (as shown in FIG. 3) engaging with corresponding holes 22 of the cover 20 (as shown in FIG. 2), or by any suitable means forming a first portion of the housing. The chassis 30 provides a second portion of the housing. Then the front panel 10 and the cover 20 are mounted on the chassis 30 to form the housing.

A latch mechanism 99 for latching and releasing the front panel 10 and the cover 20 with and from the chassis 30 of the present invention is more particularly shown in FIG. 3. The latch mechanism 99 includes a match opening 12 defined in a side of the front panel 10, a latch member 40, a spring 50 and a locking hole 32 defined in the front wall of the chassis 30. The match opening 12 is used to receive the latch member 40. In the match opening 12 there are four parallel spaced apart first, second, third, and fourth planar boards 120a, 120b, 122a and 122b extending from the back of the front panel 10. The first and the second planar boards 120a and 120b are respectively connected to upper and lower edges of the match opening 12. The first and the second planar boards 120a and 120b each define a notch 126 at their free ends. The third and forth planar boards 122a and 122b are located between the first and the second planar boards 120a, 120b and are spaced apart from the upper and lower edges of the match opening 12 at a certain distance. Inner edges of the four planar boards 120a, 120b, 122a and 122b opposite to the matching opening 12 are connected by a plate 124 therefore a trough 128 is defined between the planar boards 122a, 122b and the plate 124 and faces to the match opening 12.

Figure 4:
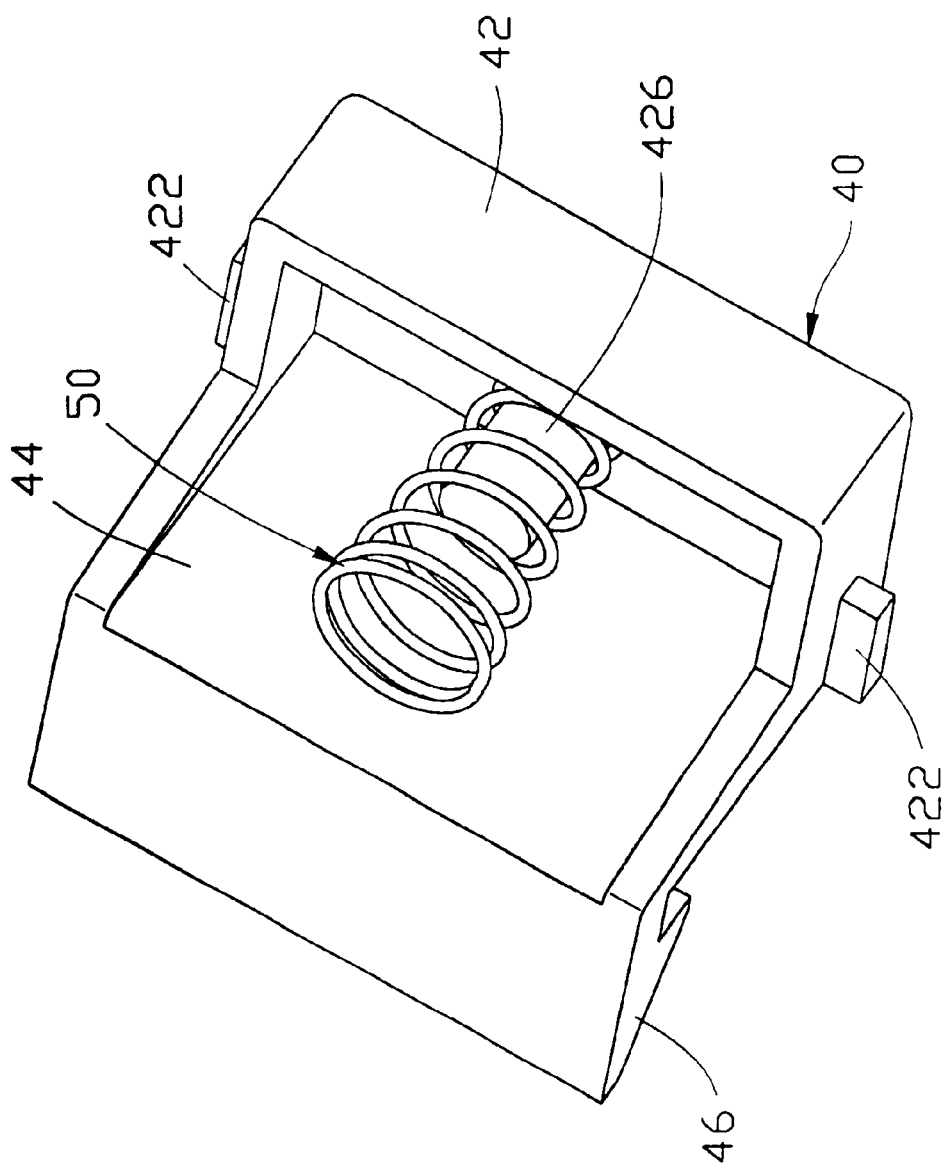
FIG. 4 is a perspective view showing a latch member and a spring of said embodiment in the state where they are assembled.

The latch member 40 which is generally retained between the front panel 10 and the cover 20, comprises a base 42 for mounting in the match opening 12 of the front panel 10. A top and a bottom of the base 42 define a pair of protrusions 422 extending upwardly and downwardly respectively for inserting into the notches 126 of the first and the second planar boards 120a, 120b respectively. There are ribs 424 on an outer side of the base 42 facing outside to facilitate pressing operation. As shown in FIG. 4, an inner side of the base 42 has a post 426 extending therefrom for positioning a spring 50. The latch member 40 further forms an L-shaped arm 44 connected to the base 42. The arm 44 terminates in a tapered hooked portion 46 having a forwardly and outwardly slanted cam surface 462 terminating in an abrupt shoulder 464.

The spring 50 can be replaced by other resilient means, such as a spring clip or others. The spring 50 positioned around the post 426 is urged between the inner side of the base 42 and the plate 124 when the latch member 40 is mounted in the match opening 12 and the spring 50 is received in the trough 128.

Figure 5:
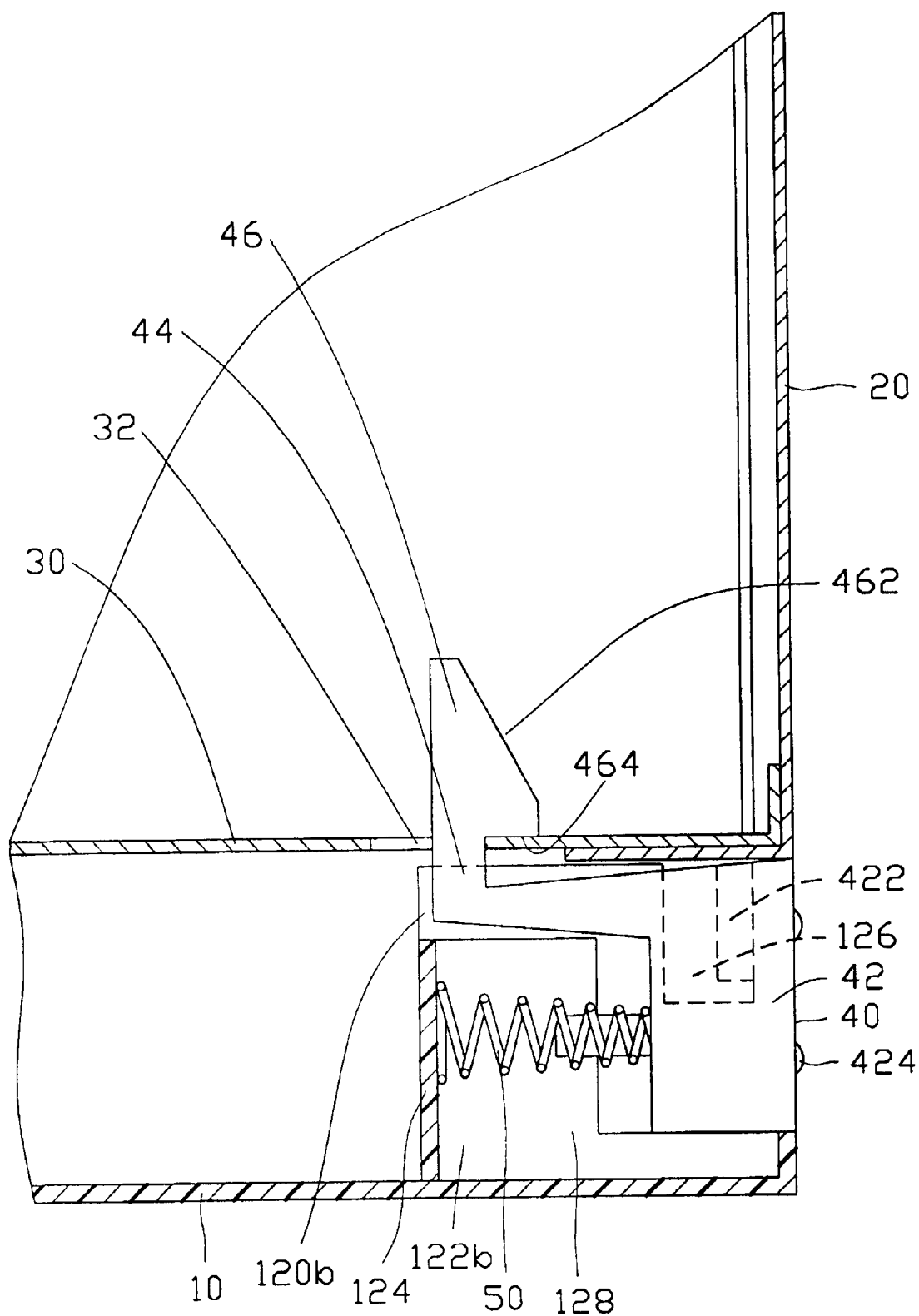
FIG. 5 is a partial sectional view showing the construction of the latch mechanism of said embodiment in the state where the front panel and the cover are latched with the chassis.

Referring to FIG. 5, when the front panel 10 and the cover 20 are configured to the chassis 30, the hooked portion 46 of the latch member 40 is firstly aligned with the locking hole 32 and then forcedly slides through the locking hole 32 with the cam surface 462 engaging the side edge of the locking hole 32. Simultaneously, the spring 50 is deformed and the latch member 40 offsets from its original position under assembly force and contacting force between the cam surface 462 and the side edge of the locking hole 32. As hooked portion 46 completely passes through the locking hole 32, the contacting force between the cam surface 462 and the side edge of the locking hole 32 loses and the spring 50 automatically extends and recovers to its original form. Simultaneously, the shoulder 464 snaps the side edge of the locking hole 32. As better shown in FIG. 5, the width of the notches 126 and the distance between the third and forth planar boards 122a, 122b and the match opening 12 are adequate to provide the base 42 and the protrusions 422 enough space for moving therein.

Figure 6:
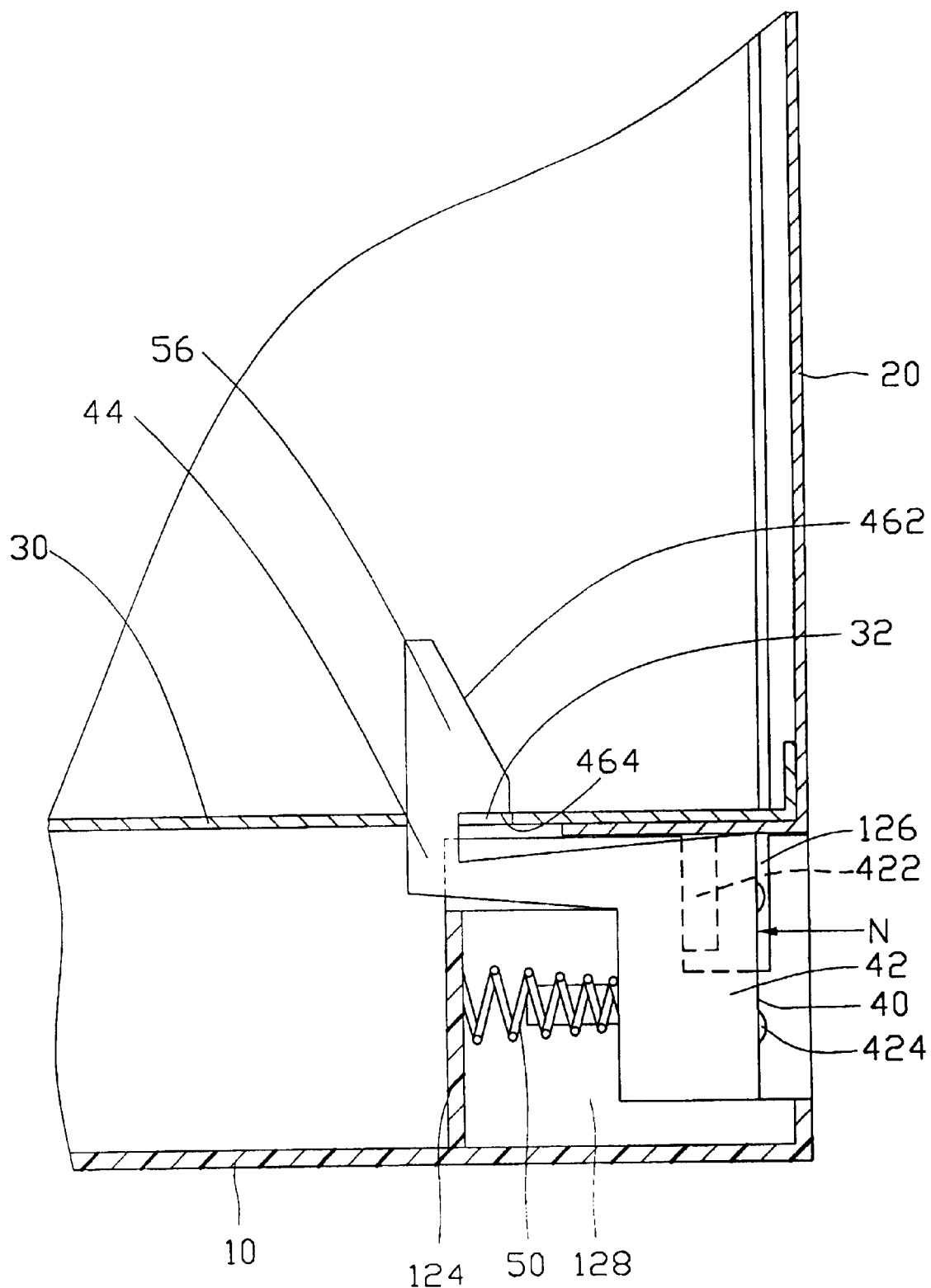
FIG. 6 is a partial sectional view showing the construction of the latch mechanism of said embodiment in the state where the front panel and the cover are to be released from the chassis and the latch mechanism are unlatched.

Positive action is required as shown in FIG. 6 to remove the front panel and the cover 20. The base 42 of the latch member 40 is firstly pressed to move in N direction in the match opening 12 thereby compressing the spring 50. This releases the abrupt shoulder 464 with the side edge of the locking hole 32 and allows front panel 10 and the cover 20 to be pulled down. Then, the spring 50 elastically extends and recovered to its original form thereby drawing the latch member 40 back to its original position.

While the present invention has been described in reference to a specific embodiment thereof, the description is illustrative and is not to be construed as limiting the invention. Various modifications to the present invention may be made to the preferred embodiment by those skilled in the art without departing from the true spirit and scope of the invention as defined by the appended claims.

I claim:

1. A latch mechanism latching and releasing a first portion of a housing with and from a second portion of the housing comprising:

a match opening defined in the first portion, a pair of parallel planar boards formed in the match opening, each of the planar boards defining a notch;

a locking hole formed in the second portion;

a latch member comprising a base mounted in said match opening and an arm integrally extending toward the second portion from the base to enter the locking hole, a top and a bottom of the base respectively forming a protrusion, the notches of the planar boards respectively receiving the protrusions, wherein the width of each notch is adequate to provide the protrusion moving therein, the latch member being movable between a locked position where the arm is locked in the locking hole and a released position where the arm disengages the locking hole; and a spring urging against the base to retain the latch member in the locked position.

2. The latch mechanism as claimed in claim 1, wherein an inner side of the base extends a post to provide one end of the spring being set thereon.

3. The latch mechanism as claimed in claim 2, wherein in the match opening there is a trough to receive the spring.

4. The latch mechanism as claimed in claim 3, wherein the trough comprises two spaced apart parallel planar boards and a side plate connected therebetween, the other end of the spring is propped against the plate.

5. The latch mechanism as claimed in claim 1, wherein the outer end of the arm provides with a hooked portion to engage the side edge of the locking hole.

6. The latch mechanism as claimed in claim 5, wherein the hooked portion has a forwardly and outwardly slanted cam surface terminating in an abrupt shoulder to engage the side edge of the locking hole.

7. The latch mechanism as claimed in claim 1, wherein the first portion of the housing is a connected front panel and a cover, and the second portion is a chassis.

8. A housing comprising:

a chassis having at least a locking hole;

a front panel having at least a match opening, a pair of parallel planar boards formed in the match opening, each of the planar boards forming a notch;

a cover connected together with the front panel to be latched and released with and from the chassis;

a latch member comprising a base mounted in the match opening of the front panel and an arm integrally extending toward the chassis from the base to enter the locking hole, a top and a bottom of the base respectively forming a protrusion, the notches of the planar boards respectively receiving the protrusions, wherein the width of each notch is adequate to provide the protrusion moving therein, the outer end of the arm provided with a hooked portion to engage the side edge of the locking hole, the latch member being movable between a locked position where the arm is locked in the locking hole and a position where the arm disengages the locking hole; and a spring urging against the base to retain the latch member in the locked position.

9. The housing as claimed in claim 8, wherein the back of the base extends a post to provide one end of the spring being set thereon.

10. The housing as claimed in claim 9, wherein in the match opening there is a trough to receive the spring.

11. The housing as claimed in claim 10, wherein the trough comprises two spaced apart parallel planar boards and a side plate connected therebetween, the other end of the spring is propped against the plate.

12. A housing comprising:

a chassis defining at least a locking hole;

a front panel and a cover assembled to said chassis in a front-to-back direction;

a latch member retainably positioned between said front panel and said cover, and also being moveable in a lateral direction perpendicular to said front-to-back direction, said latch member including a base exposed to and accessible from an exterior in said lateral direction, and a hook portion releasably engaged with the locking hole to prevent the front panel and the cover from forward moving.

13. The housing as claimed in claim 12, wherein said housing includes a vertical plane in which said locking hole is defined and extending therethrough in said front-to-back direction.

14. The housing as claimed in claim 12, wherein said latch member is urged to be in an outermost position by a resilient device.

* * * * *